United States Patent
Lee et al.

(10) Patent No.: US 7,060,541 B2
(45) Date of Patent: Jun. 13, 2006

(54) METHOD OF FABRICATING THIN FILM TRANSISTOR TFT ARRAY

(75) Inventors: Chi-Shen Lee, Hsinchu (TW); Cheng-Chung Chen, Hsinchu (TW); Chi-Lin Chen, Hsinchu (TW); Chai-Yuan Sheu, Hsinchu (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 226 days.

(21) Appl. No.: 10/673,325

(22) Filed: Sep. 30, 2003

(65) Prior Publication Data

US 2005/0059190 A1   Mar. 17, 2005

(30) Foreign Application Priority Data

Sep. 16, 2003   (TW)  ............................... 92125528 A

(51) Int. Cl.
*H01L 21/00*     (2006.01)
*H01L 21/84*     (2006.01)

(52) U.S. Cl. ...................................... 438/149; 438/151
(58) Field of Classification Search ................ 438/149, 438/151
See application file for complete search history.

(56) References Cited

U.S. PATENT DOCUMENTS 6,509,614 B1 * 1/2003 Shih .......................... 257/350

* cited by examiner

*Primary Examiner*—Scott Geyer
(74) *Attorney, Agent, or Firm*—Bacon & Thomas PLLC

(57) ABSTRACT

A method of fabricating a thin film transistor (TFT) array involves ion replacement by oxidation-reduction processes for implementing the metal wiring layout of TFT-LCDs. This can overcome metal etching difficulties and achieve automatic alignment. The method of the invention replaces traditional lithographic etching techniciues.

9 Claims, 5 Drawing Sheets

METHOD OF FABRICATING THIN FILM TRANSISTOR TFT ARRAY

FIELD OF THE INVENTION

The present invention relates to a method of fabricating a thin film transistor (TFT) array. It uses the theory of oxidation-reduction to manufacture metal wiring for implementing the metal wiring layout of the TFT-LCDs.

BACKGROUND OF THE INVENTION

The quality of TFT fabrication increases constantly. However, people make more demands on TFT devices to enhance their life quality. Monochrome display monitors no longer meet present image industry requirements. Further, the cathode-ray tube CRT has gradually been replaced by the flat panel display FPT as well as the expensive plasma panel display PPD in the color display monitor.

In order to improve upon the competition for liquid crystal display (LCD) products, the latest display panels, and in particular the thin-film transistor liquid crystal display (TFT-LCD), have been extensively researched The conventional TFT-LCD is used in large-area applications, and as a result, has the disadvantage of being subject to the delay phenomenon caused by influence of the resistor capacitor RC on the image display.

Moreover, the conventional methal wiring process uses an expensive physical vapor deposition method (PVD), and therefore, the manufacturing cost of the TFT-LCD is more expensive. Apart from this, the consequent thin film process such as etching and high-temperature tempering of the low resistance metal having high diffusion, such as Cu, is troublesome and causes component defects. The present invention can overcome the problem of the conventional technique.

SUMMARY OF THE INVENTION

The present invention relates to a method of fabricating a TFT array. It uses the theory of oxidation reduction to manufacture metal wiring for implementing the metal wiring layout of TFT-LCDs. Moreover, it decreases high-diffusion wiring exposure times in the masking process and decreases component defects in the metal wiring during multiple masking processes.

The present invention uses an α-Si layer as a seed layer. Then, it uses a low-resistance metal with stronger oxidation ability for Si as well as a chemical plating method to implement the metal wiring layout of the TFT-LCDs. This, therefore, can replace the lithography etching method conventionally used in the metal wiring layout. Further, it can enhance the options of the metal wiring material in the TFT-LCD. Besides, the delay phenomena of the resistor capacitor RC can be decreased.

For a more complete understanding of the present invention and for further advantages thereof, reference is now made to the following description taken in conjunction with the accompanying drawing, in which:

DETAILED DESCRIPTION OF THE PREFERRED EMBODIMENTS

Figure 1A:
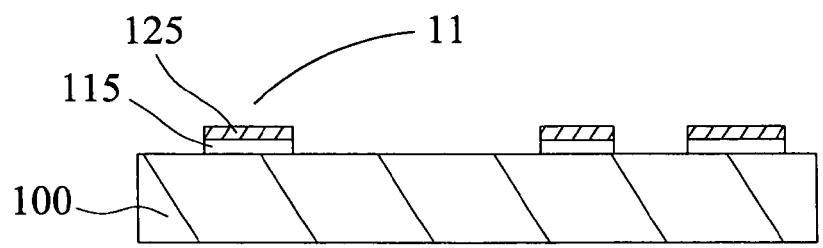
FIGS. 1A–1L illustrate preferred embodiments according to the present invention by showing the structure of each process in the manufacturing steps.
Figure 1B:
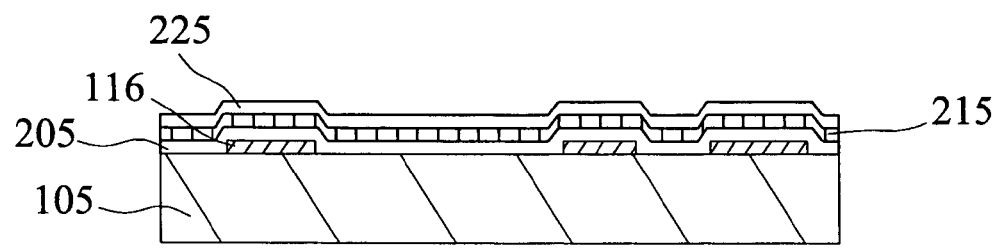
Figure 1C:
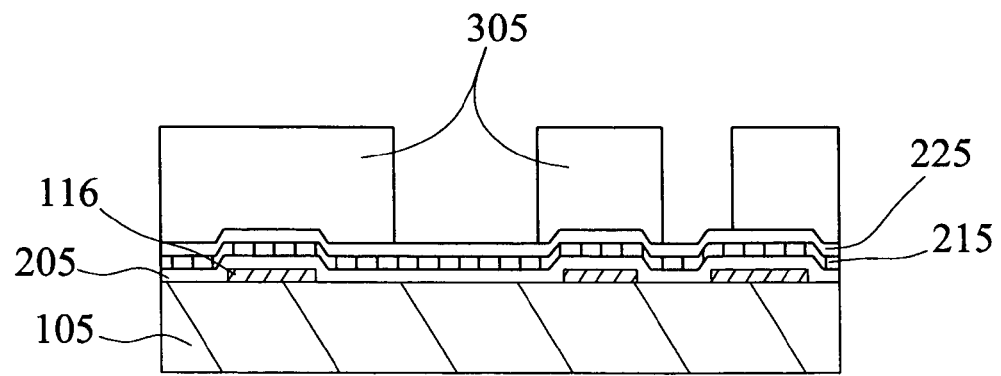

FIG. 1A illustrates step 1 of one of the preferred embodiments according to the present invention, in which a mask is used to define the position of the gate electrode metal wiring on the substrate 100. Then, α-Si seed layer 115 is formed on the position. Then, the desired-plated metal 125 and the graphs of the desired-plated area which being are made by relatively strong oxidation-reduction materials processes of ion replacement to form the gate electrode 11. The ion of the desired metal can be Cu, Al, Ag, In, Ti, W, and MO. The desired-plated graph made from the stronger reduction materials can be an α-Si seed layer 15. Then, as shown in FIG. 1B, the deposition of the dielectric layer 205 on the resulting ion-replaced seed layer 116 is carried out, followed by deposition of α-Si layer 215, and N+ Si layer 225. FIG. 1B, shows step two of the preferred embodiment illustrated in FIG. 1. The α-Si layer can be used as a conducting channel, while the N+ Si layer can be used as an ohmic contact layer. The above deposition process forming the dielectric layer 205, α-Si layer 215, N+ Si layer 225 can use a variety of deposition methods, which may include physical vapor deposition, low pressure chemical vapor deposition or plasma enhanced chemical vapor deposition, etc. Since oxidation-reduction ion replacement also affects the substrate, substrate 105 is referred-to as substrate 105 in FIGS. 1B et seq.

Figure 1D:
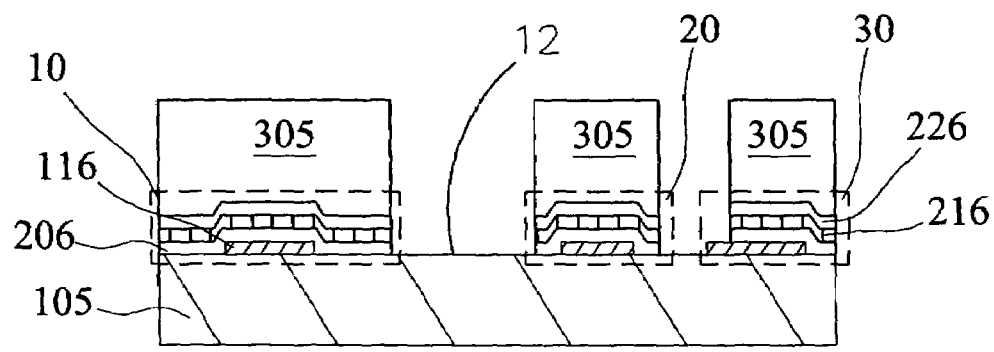
Figure 1E:
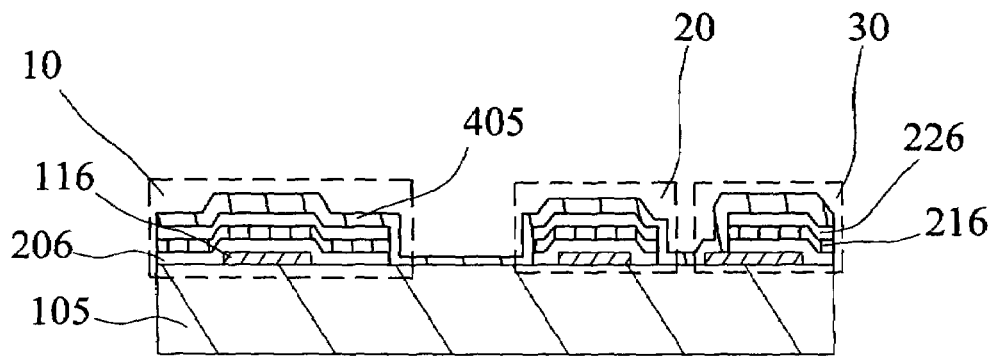

Following the above step, the preferred method completes the deposition of the N+ Si layer. Please refer to FIG. 1C, which shows step 3 of the above-described one of the preferred embodiments. This step defines the contact windows 12 and shields the partial N+ Si layer 225 against entering the masking process, by using multiple photo-resists 305 and then using lithography etching for removing non-shielded areas to form multiple contact windows 12 between the shielded areas 10, 20, and 30, the non-etched portions of layers 215 and 225 being indicated by reference numerals 216 and 226. FIG. 1D shows step 4 of the manufacturing process, during which a photo-resist lift-off is carried out for implementing the contact window. FIG. 1E shows step 5 of the preferred embodiment of the present invention, in which a transparent conducting layer 405 is formed by deposition. The the material of the transparent conducting layer can be Indium Tin Oxide (ITO) or Indium-Doped Zinc Oxide (IZO). Then, a second metal wiring layer is defined on the transparent conducting layer.

Figure 1F:
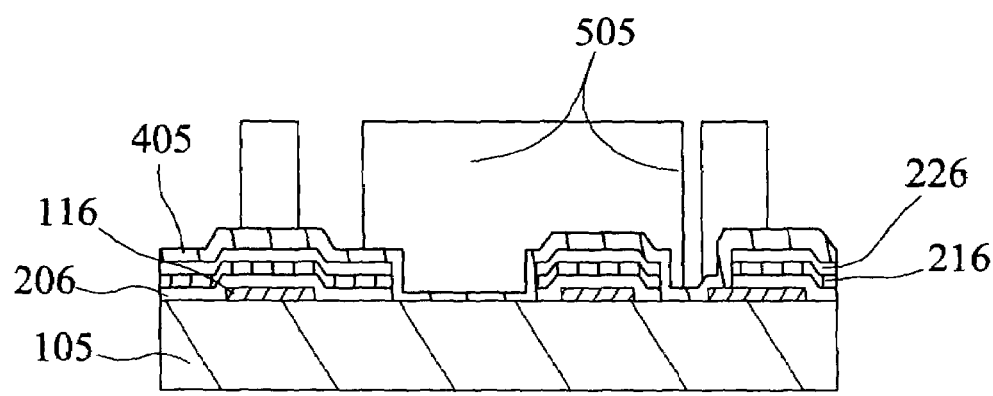
Figure 1G:
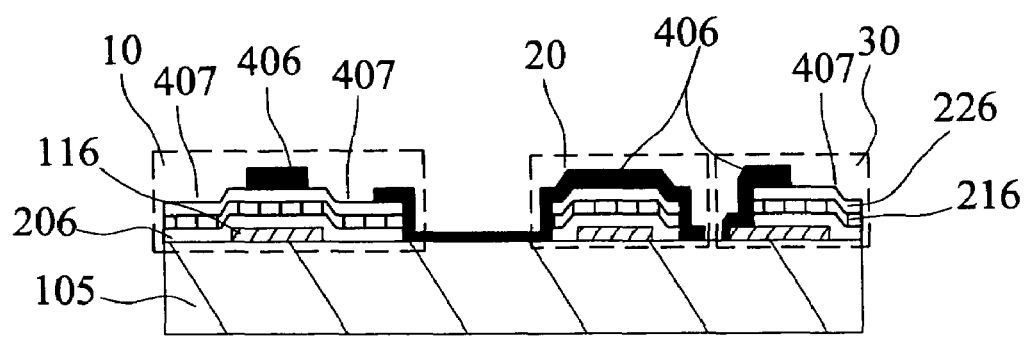
Figure 1H:
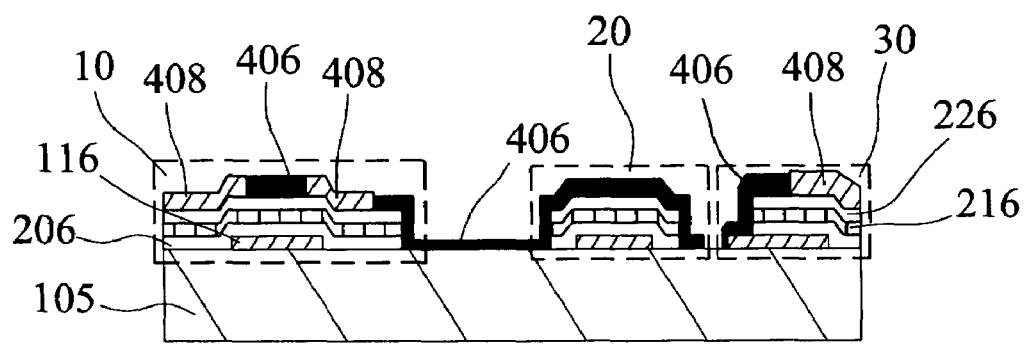

FIG. 1F step 6 of the preferred embodiment. In this step, photo-resist 505 is used to define the position of the second metal wiring. In the mean time, the source electrode and the drain electrode are defined. Then, a masking process and lithography etching technique are carried out, leaving behind non-etched portions 406 of the transparent conducting layer. The portions of the partial transparent conducting layer that are removed expose a partial N+ Si layer as a N+ seed layer 407. The N+ Si seed layer 407 reacts with the material of the wiring metal to implement the replacement. The replacement reaction of the wiring metal and the N+ Si seed layer 407 can be a replacement reaction of same type metals or an addition reaction. Please refer to FIG. 1G, which shows step 7 of the above-described one of the preferred embodiments according to present invention. This step involves reaction by the chemical electric potential difference of two substances to form the second metal wiring 408 on the exposed area of the N+ Si seed layer 407. The area covered with residue transparent conducting layer cannot have second metal wiring 408 on it, but has a self-alignment. Moreover, the chemical reaction can use a electrical plating or non-electrical plating method. Then, referring to FIG. 1H, step 8 is carried out to implement the second metal wiring 408 layout.

Figure 1I:
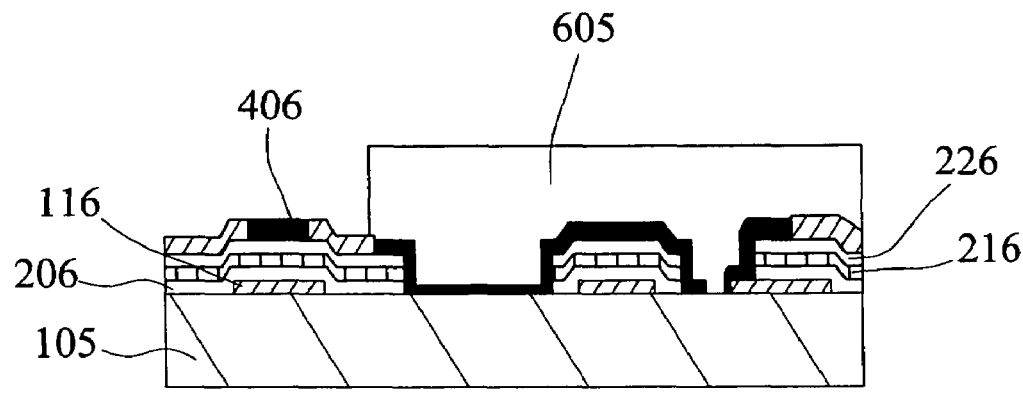
Figure 1J:
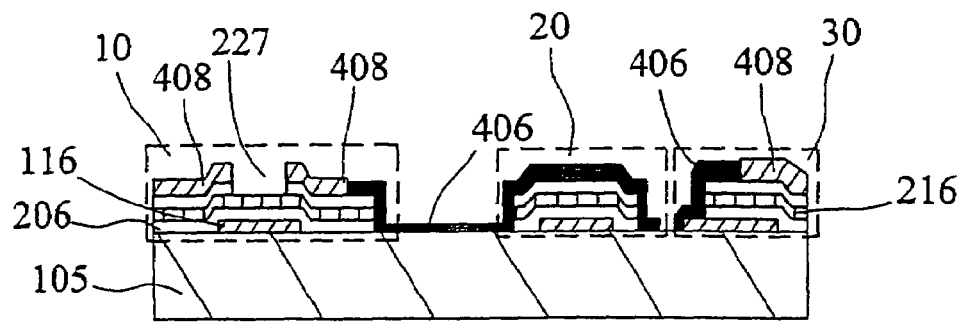
Figure 1K:
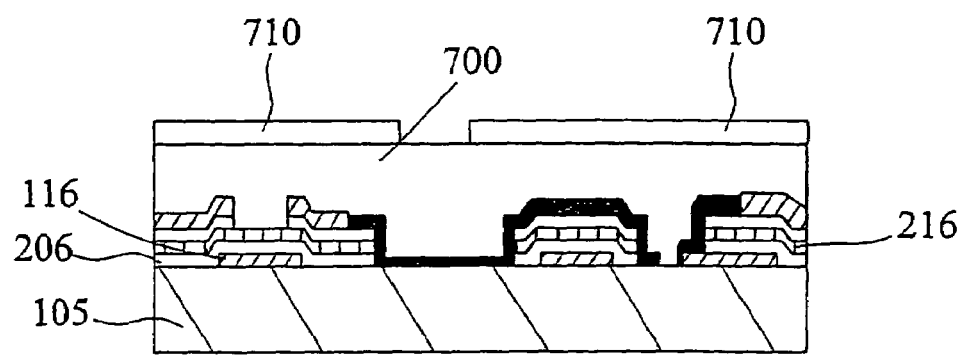
Figure 1L:
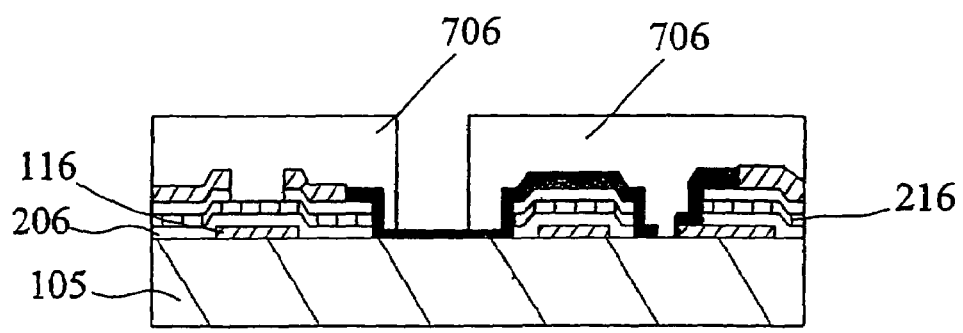

FIG. 1I illustrates step 9 of the preferred embodiment of the present inventions, in which a wiring channel is defined. In this step, photo-resist 605 is used to shield the position of the non-wiring channel. The photo-resist can be a positive-type photo-resist. After completing the masking process, lithography etching is used for forming wiring channel 227. Please refer to FIG. 1J, which shows step 10 of the preferred method. In this step, wiring channel is implemented and the passivation layer is finally formed. Please refer to FIG. 1K, which shows step eleven. By using the above deposition method, a passivation layer is deposited, and then the fourth photo-resist 710 is placed on the component. Moreover, the passivation layer 700 without the fourth photo-resist covering is removed for forming the component passivation layer 706. Further, the fourth photo-resist 710 is removed. In step 11 shown in FIG. 1L, manufacture of the TFT array is completed.

Figure 2:
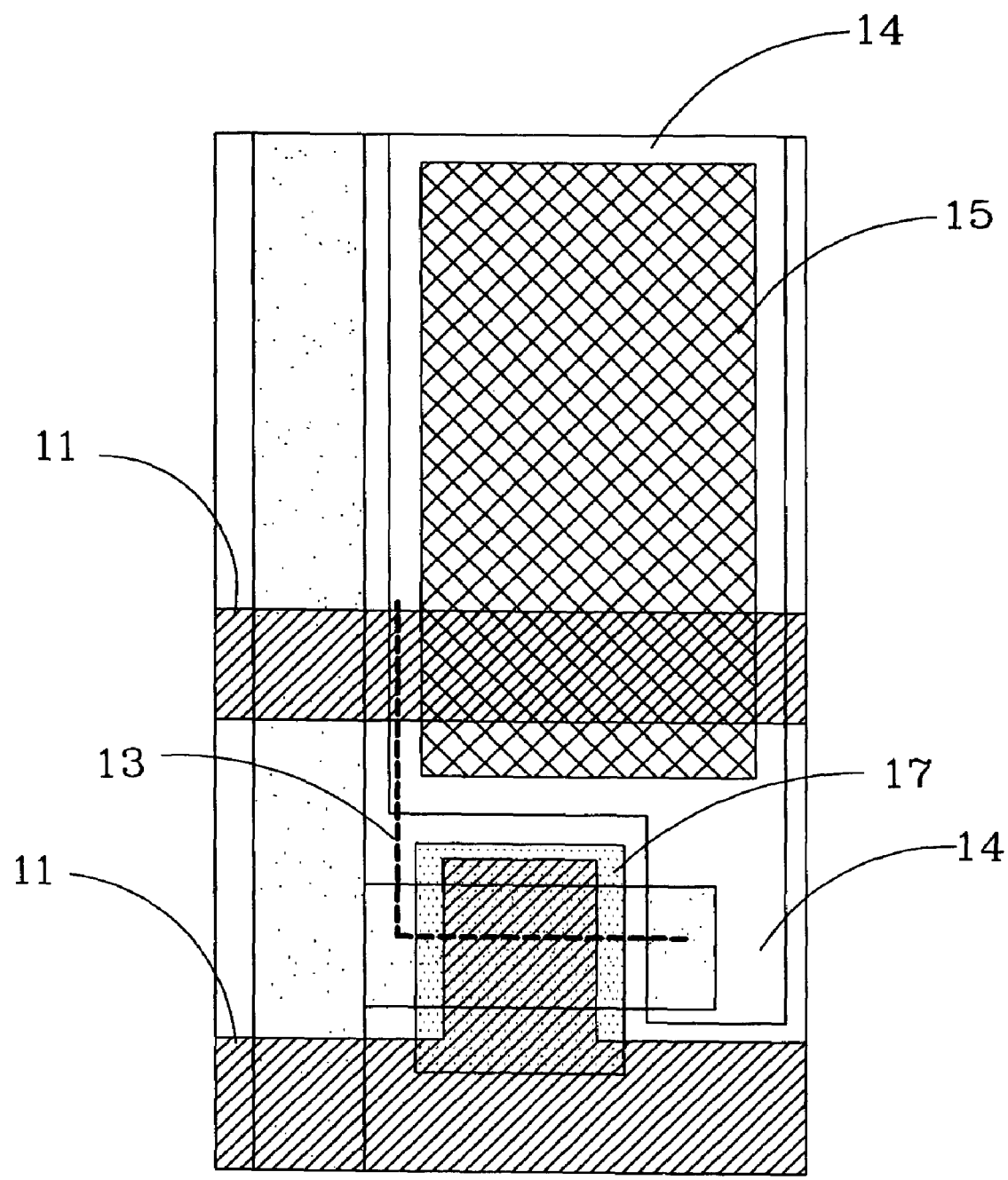
FIG. 2 is a plan view of a TFT-LCD made by the present invention.

Please refer to FIG. 2, which shows a circuit made by the present invention. According to the above description, the first masking process is processed firstly for forming the first metal wiring 11. Also, the first masking process defines the position of the gate electrode. The wiring metal of the gate electrode is implemented by means of the replacement method. Then, a second masking process is used to form a signal area and the contact window by depositing the transparent conducting layer 14. Further, the third masking process defines the source electrode and the drain electrode 13. The wiring metal can be a partial N+ Si layer in order to process the self-alignment replacement reaction for the seed. Moreover, a fourth masking process is carried out for forming a wiring channel 17. Then, the fifth masking process is used as the process for forming a passivation layer 15. The method of fabricating a TFT according to the present invention focuses more on the gate during initial formation, and on the third masking process. It uses the oxidation-reduction character of the chemical plating method to form metal wiring for implementing the metal wiring layout of the TFT-LCDs. Further, it can avoid the exposure of the metal wiring that occurs during the masking process, and thereby prevent component defects from occurring.

Although the present invention has been described in detail with respect to alternate embodiments, various changes and modifications may be suggested to one skilled in the art, and it should be understood that various changes, suggestions, and alternations can be made hereto without departing from the spirit and scope of the invention as defined by the appended claims.

What is claimed is:

1. A method of fabricating a TFT array, comprising the steps of;

forming a gate electrode and using a replacement method of an α-Si seed which is defined by a first mask to deposit a first wiring on the substrate, and defining the gate electrode of the TFT array;

forming a dielectric layer, the α-Si layer, and an N+ layer, the layers being deposited in order, and the dielectric covering the top side of the gate electrode, and the α-Si layer being between the dielectric layer and the N+ Si layer;

using a second mask to define multiple contact windows;

depositing a transparent conducting layer, and the transparent conducting material placed on the multiple contact windows;

defining a source and drain electrodes and using a third mask to define the source electrode and the drain electrode in the TFT array;

etching channel; it using coverage of a fourth mask to etch the component contact window as a conducting channel; and placing a passivation layer, and depositing a passivation layer, and the fourth mask placed on the passivation layer, and processing etching on the passivation layer of non-fourth mask coverage for implementing TFT array.

2. The method of fabricating a TFT array according to claim 1, wherein the replacement method is a chemical plating method, that uses a low-resistance metal with stronger oxidation ability than Si, and works with chemical plating method to process oxidation-reduction reaction, and the area of the α-Si definition is replaced by a first conducting metal.

3. The method of fabricating a TFT array according to claim 1, the process of the defining gate electrode used the deposition methods to define, and a conducting metal depositing deposited on the gate electrode can be made of Cu, Al, Ag, Ni, Ti, W, or MO.

4. The method of fabricating a TFT array according to claim 1, the process of the forming dielectric layer can use a continuous deposition method to form the dielectric layer with oxide material.

5. The method of fabricating a TFT array according to claim 1, the process of the forming dielectric layer can use low-pressure chemical vapor deposition (LPCVD), or plasma enhanced chemical deposition PECVD) to implement.

6. The method of fabricating thin a TFT array according to claim 1, a material of the transparent conducting layer in the process of the depositing transparent conducting layer is Indium Tin Oxide (ITO) or Indium-Doped Zinc Oxide (IZO).

7. The method of fabricating a TFT array according to claim 1, the process of the defining gate electrode and drain electrode uses stronger oxidation ability in the second conducting metal rather than Si has to implement the replacement, and a partial N+ Si layer is as a N+ Si seed to process oxidation-reduction reaction, and the replaced parts of the N+ Si seed are defined as the source electrode and the drain electrode.

8. The method of fabricating a TFT array according to claim 1, a second conducting metal is made of Cu, Al, Ag, In, Ti, W, or MO materials.

9. The method of fabricating a TFT array according to claim 1, the third masking process can use a positive-type of a photo-resist to process shielding.

* * * * *